United States Patent
Stowe et al.

(10) Patent No.: US 8,410,443 B1
(45) Date of Patent: Apr. 2, 2013

(54) INTEGRATED BACKSCATTERED ELECTRON DETECTOR WITH CATHODOLUMINESCENCE COLLECTION OPTICS

(75) Inventors: David J. Stowe, Caversham (GB); John Hunt, Fremont, CA (US); Simon A. Galloway, Oxford (GB)

(73) Assignee: Gatan, Inc., Warrendale, PA (US)

( * ) Notice: Subject to any disclaimer, the term of this patent is extended or adjusted under 35 U.S.C. 154(b) by 35 days.

(21) Appl. No.: 13/280,952

(22) Filed: Oct. 25, 2011

(51) Int. Cl.
*G01J 1/00* (2006.01)
(52) U.S. Cl. .................................. 250/336.1
(58) Field of Classification Search .... 250/336.1–336.2, 250/330–335
See application file for complete search history.

(56) References Cited

U.S. PATENT DOCUMENTS

| 7,462,839 B2 | 12/2008 | Gnauck et al. | |
|---|---|---|---|
| 7,707,041 B2 | 4/2010 | Bonham et al. | |
| 2009/0179151 A1* | 7/2009 | Cheng et al. | 250/307 |
| 2010/0123077 A1* | 5/2010 | Mooney et al. | 250/307 |
| 2011/0303843 A1* | 12/2011 | Omori et al. | 250/307 |

FOREIGN PATENT DOCUMENTS

JP 11096956 9/1999

* cited by examiner

*Primary Examiner* — Kiho Kim
(74) *Attorney, Agent, or Firm* — Caesar, Rivise, Bernstein, Cohen & Pokotilow, Ltd.

(57) ABSTRACT

An apparatus for simultaneous detection of backscattered electrons and photons from a sample. The device includes a direct detection backscattered electron detector and a photon detector. The backscattered electron detector has a reflective surface that reflects photons emitted by the sample onto the photon detector.

12 Claims, 5 Drawing Sheets

US 8,410,443 B1

INTEGRATED BACKSCATTERED ELECTRON DETECTOR WITH CATHODOLUMINESCENCE COLLECTION OPTICS

FIELD OF THE INVENTION

This invention relates to image detectors for electron microscopy. In particular the invention relates to simultaneous detection of backscattered electrons and cathodoluminescence emitted by a sample.

BACKGROUND OF THE INVENTION

When a high energy electron or ion beam strikes a sample, photons can be emitted. These emitted photons are also known as cathodoluminescence. The collection and detection of these photons in the wavelength range from UV through visible to IR, can provide a wealth of information about the sample under investigation. However, the signal to be detected can be small and in order to obtain the highest signal to noise ratio, minimize acquisition times and reduce the excitation energy required it is desirable to collect the largest proportion of emitted photons as possible. The most efficient manner of collecting photons emitted from a sample in an electron microscope is by using an optical element which subtends a large solid angle and which detects the photons directly or directs the photons towards a light sensitive element where the photons can be detected and measured; typically, the optical element contains an aperture through which the incident primary electron beam may pass.

Where the optical element used to direct the emitted photons covers such a large solid angle the use of other detectors simultaneously is compromised unless line of sight is provided by sacrificing the solid angle subtended by the optical element. A large solid angle is often required as the photon signal levels is typically many orders of magnitude lower than other signals in the SEM. For many signals in the SEM this is acceptable however, this is not the case for backscattered electrons for several reasons:

1) The emission direction of backscattered electrons and photons is similar and therefore collectors/detectors are required to occupy the same space. Therefore, a large sacrifice in both signals is required so that they may be sensed simultaneously. Backscattered electron detectors are typically mounted to the bottom of the pole piece or inserted immediately below, and the optical element used to direct photons is typically situated between the sample and the backscattered detector, thus obscuring the signal to the back scattered electron detector.

2) Sacrificing part of the optical element's solid angle allows the backscattered detector line of sight to the sample, however the optical element is typically thick (4-20 mm) and the distance between the sample and the backscattered detector large therefore further compromising the solid angle subtended by the backscattered detector in comparison to normal operation.

Detection of photons and backscattered electrons simultaneously is not novel; however, this has only been achieved through large sacrifices in efficiency—typically greater than or equal to 50% reduction in comparison to optimum operation of either detector. This is often unacceptable for many applications. Furthermore, this has only been achieved by the use of two separate instruments.

Publications in the general field include U.S. Pat. Nos. 7,462,839 and 7,707,041 and Japanese Patent Abstract publication no. 11,096,956 by Hiromasa. All references are incorporated herein by reference.

SUMMARY OF THE INVENTION

In an exemplary embodiment, the invention comprises an apparatus for simultaneous detection of backscattered electrons and photons from a sample. The device includes a direct detection backscattered electron detector and a photon detector. The backscattered electron detector has a reflective surface that reflects photons emitted by the sample onto the photon detector. In an embodiment, the reflective surface is convex. In a further embodiment, the reflective surface is planar. In a further embodiment, the reflective surface of the backscattered electron detector is convex. In a further embodiment, the reflective surface of the backscattered electron detector is a three dimensional concave surface. Exemplary reflective surfaces include aluminum and gold In a further embodiment the apparatus includes a direct detection backscattered electron detector, a photon detector; and an optical element. In this embodiment, the backscattered electron detector is embedded in the optical element and is angled to reflect photons toward the photon detector.

Other advantages and novel features of the invention will become apparent to those skilled in the art upon examination of the following detailed description of a preferred embodiment of the invention and the accompanying drawings.

DETAILED DESCRIPTION

Figure 1:
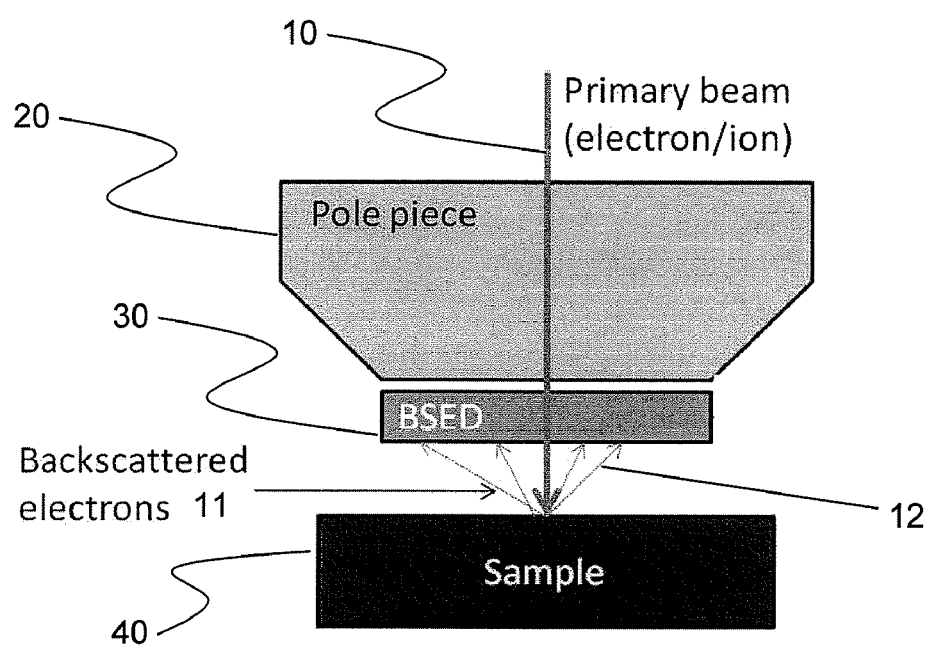
FIG. 1. is a diagram of a prior art electron microscope to detect backscattered electrons.

FIG. 1 shows a standard electron microscope with a direct detection backscattered electron detector 30. The electron beam 10 is directed through the pole piece 20 and the detector 30 to the sample 40. Backscattered electrons 11 leave the surface of the sample 20 and are detected by the detector 30. The detector is a direct electron detector as opposed to a detector comprising a scintillator that converts electrons to photons.

Figure 2:
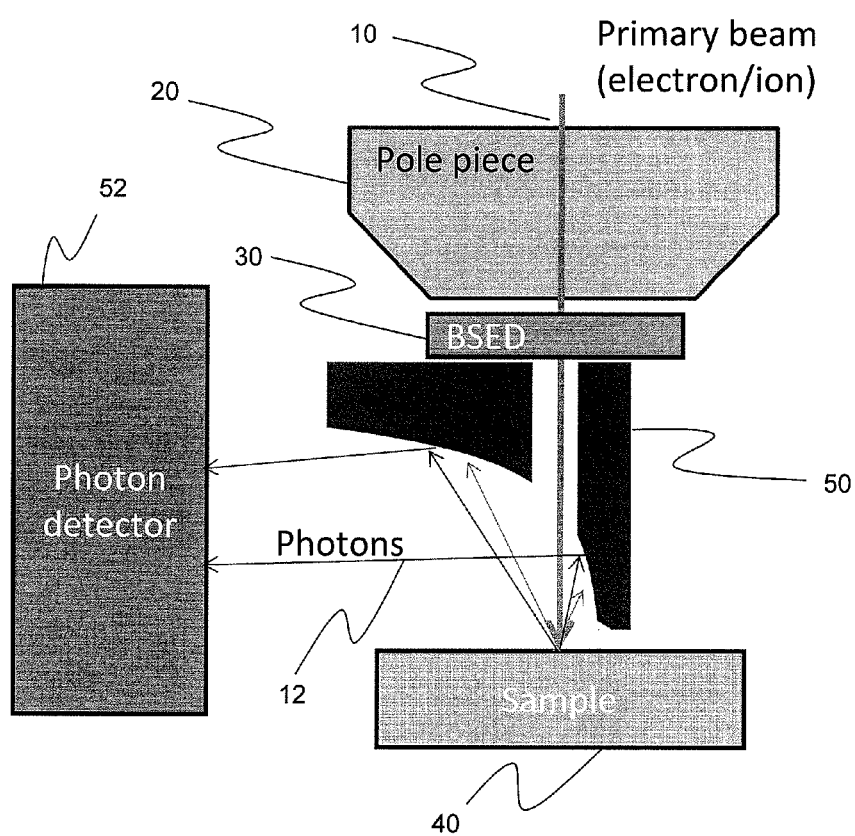
FIG. 2 is a diagram of a prior art electron microscope to detect backscattered electrons and photons

FIG. 2 shows a prior art system for detecting cathodoluminescence photons 14 produced in the sample 40. A photon collection mirror 50 is placed between the backscattered electron detector 30 and the sample 40. Photons 12 produced by the sample 40 are directed by the mirror 50 to a photon detector 52. This configuration has the disadvantage that the mirror blocks a significant portion of the backscattered electrons from reaching the detector 30.

Figure 3:
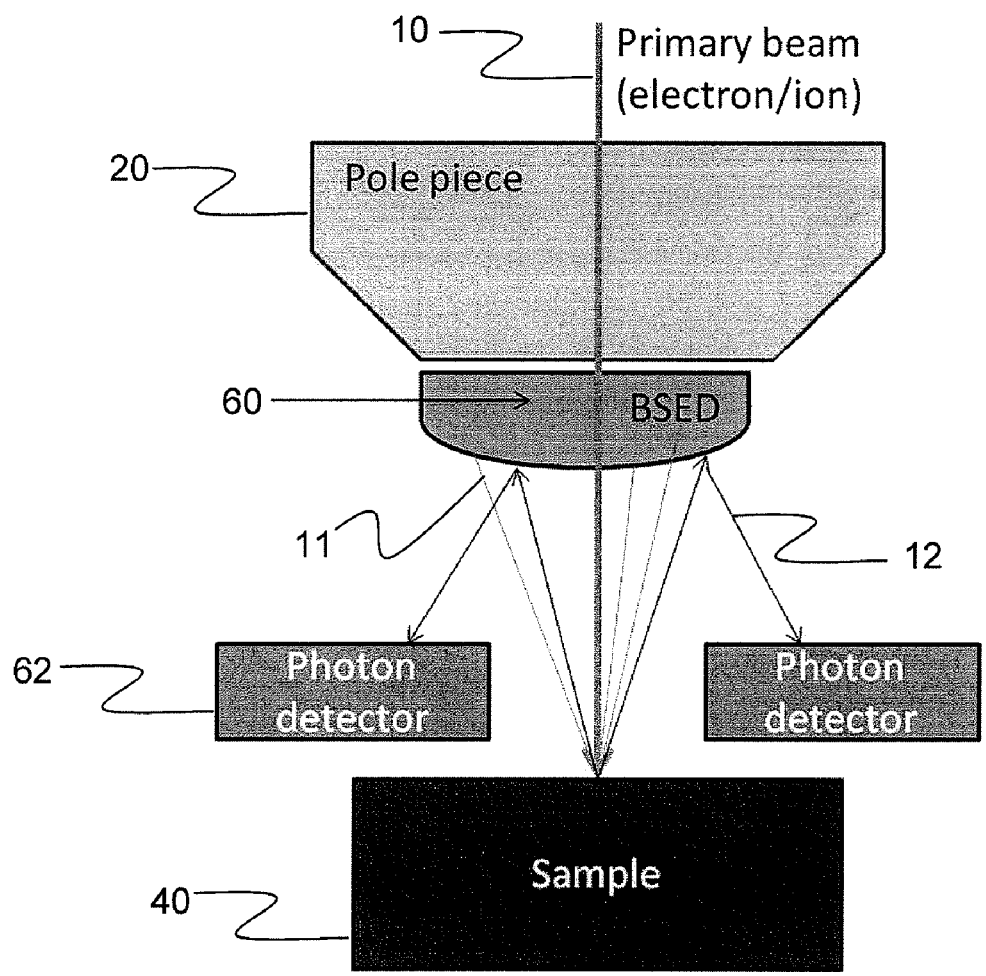
FIG. 3 is a diagram of an electron microscope to simultaneously detect backscattered electrons and photons, wherein the backscattered electron detector has a convex mirrored surface to reflect photons.

In an embodiment of the invention shown in FIG. 3, a semiconductor diode 60 for sensing backscattered electrons 11 (e.g. a silicon photodiode/avalanche diode) is shaped to direct photons 12 to an optical detector 62. A reflective coating applied to the diode 60 increases the reflectivity of the diode. Reflective coatings include aluminum and gold.

Figure 4:
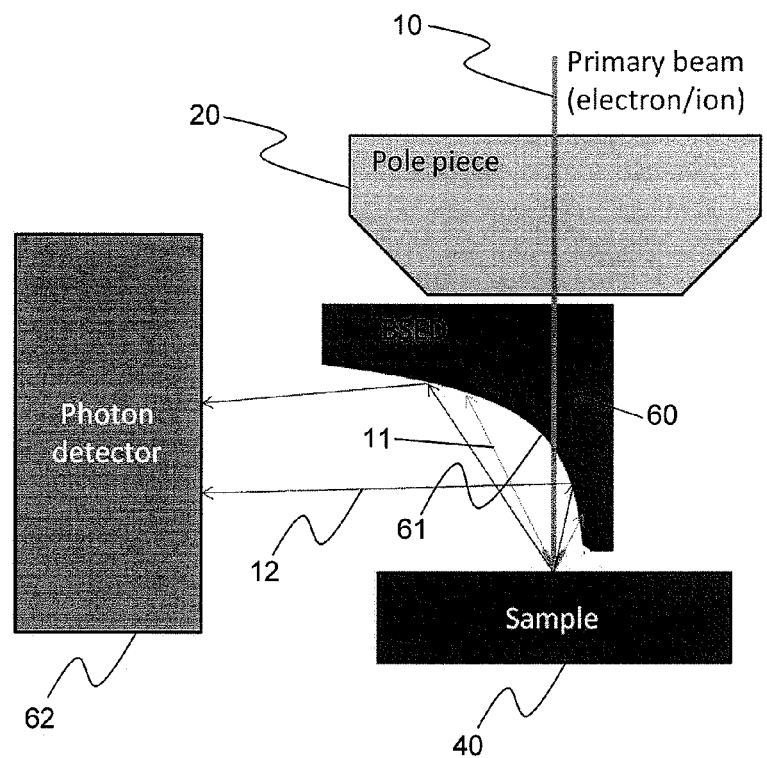
FIG. 4 is a diagram of an electron microscope to simultaneously detect backscattered electrons and cathodoluminesence, wherein the backscattered electron detector has a concave mirrored surface to reflect photons.

In an alternate embodiment, shown in FIG. 4, the diode 60 has a three dimensional concave surface 61, such as an ellipsoidal or paraboloidal surface. This type of surface collimates or focuses the photons 12 onto other optical instrumentation, which can also include a conduit of the light to an external photon detector, (e.g. PMT or photodiode, or it can be the actual detector itself).

Figure 5:
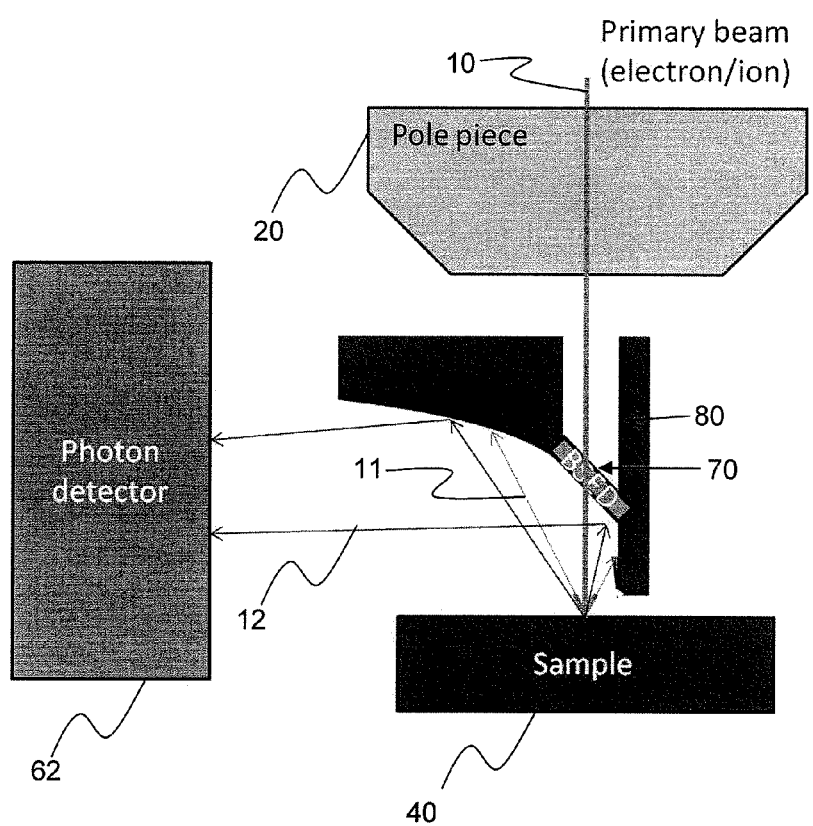
FIG. 5 is a diagram of a further embodiment of an electron microscope to simultaneously detect backscattered electrons and cathodoluminesence wherein a small backscattered electron detector is mounted in a photon directing element.

In a further embodiment, shown in FIG. 5, a miniature backscattered electron detector 70 is mounted within a photon directing element 80. Mounting the detector 70 close to the reflective plane of the optical element 80 means that the detector functions at a short working distance, compensating for the reduction in size by maintaining a large solid angle for the detector 70. Use of a miniature backscattered electron detector minimizes solid angle loss of the photon collection optical element 80. If a concave optical element (e.g. paraboloidal or ellipsoidal) is used, angling of the backscattered electron detector to reflect photons towards the photon detector minimizes optical losses as a result of the sacrificed solid angle of the optical element.

In a further embodiment, the optical element 80 is made from conductive but highly reflective material e.g. diamond-turned aluminum.

In a further embodiment, the backscattered electron detector is a silicon diode supported on a carrier for physical support.

While the invention has been described in detail and with reference to specific examples thereof, it will be apparent to one skilled in the art that various changes and modifications can be made therein without departing from the spirit and scope thereof.

We claim:

1. An apparatus for detection of backscattered electrons and photons from a sample, comprising:
a direct detection backscattered electron detector; and
a photon detector;
wherein said backscattered electron detector comprises a reflective surface that reflects photons emitted by the sample onto said photon detector.

2. The apparatus of claim 1, wherein said reflective surface of said backscattered electron detector is convex.

3. The apparatus of claim 1, wherein said reflective surface of said backscattered electron detector is a three dimensional concave surface.

4. The apparatus of claim 3, wherein said reflective surface is selected from the three dimensional geometric group consisting of an ellipsoidal surface and a paraboloidal surface.

5. The apparatus of claim 1, wherein said reflective surface is selected from the group consisting of aluminum and gold.

6. An apparatus for detection of backscattered electrons and photons from a sample, comprising:
a direct detection backscattered electron detector;
a photon detector; and
an optical element;
wherein said backscattered electron detector is affixed within said optical element.

7. The apparatus of claim 6 wherein said backscattered electron detector is removably affixed within said optical element.

8. The apparatus of claim 6, wherein said optical element is a concave reflector and wherein a primary electron beam passes through said backscattered electron detector and wherein said optical element directs the photons at an approximately 90 degree angle to said primary electron beam.

9. The apparatus of claim 8, wherein said optical element is wherein said reflector is selected from the three dimensional geometric group consisting of an ellipsoidal surface and a paraboloidal surface.

10. The apparatus of claim 6, wherein said optical element is a planar reflector.

11. The apparatus of claim 6, wherein said backscattered electron detector is angled to reflect photons toward said photon detector.

12. The apparatus of claim 8, wherein said reflective surface is selected from the group consisting of aluminum and gold.

* * * * *